(12) United States Patent
Chi et al.

(10) Patent No.: US 11,984,500 B2
(45) Date of Patent: May 14, 2024

(54) STRUCTURE AND METHOD OF NEW POWER MOS AND IGBT WITH BUILT-IN MULTIPLE VT'S

(71) Applicant: SiEn (QingDao) Integrated Circuits Co., Ltd., Shandong (CN)

(72) Inventors: Min-Hwa Chi, Qingdao (CN); Dongyang Zhou, Qingdao (CN); Jinpeng Qiu, Qingdao (CN); Peng Li, Qingdao (CN); Conghui Liu, Qingdao (CN)

(73) Assignee: SiEn (QingDao) Integrated Circuits Co., Ltd., Qingdao (CN)

( * ) Notice: Subject to any disclaimer, the term of this patent is extended or adjusted under 35 U.S.C. 154(b) by 250 days.

(21) Appl. No.: 17/527,035

(22) Filed: Nov. 15, 2021

(65) Prior Publication Data

US 2022/0209005 A1 Jun. 30, 2022

(30) Foreign Application Priority Data

Dec. 31, 2020 (CN) .......................... 202011633780.5

(51) Int. Cl.
*H01L 29/78* (2006.01)
*H01L 29/66* (2006.01)
(Continued)

(52) U.S. Cl.
CPC .... *H01L 29/7813* (2013.01); *H01L 29/66348* (2013.01); *H01L 29/66734* (2013.01);
(Continued)

(58) Field of Classification Search
CPC ........... H01L 29/7813; H01L 29/66348; H01L 29/66734; H01L 29/7397; G11C 11/56; H03K 19/0027
(Continued)

(56) References Cited

U.S. PATENT DOCUMENTS

| 10,756,213 B2 | 8/2020 | Chi et al. |
| 2009/0267125 A1* | 10/2009 | Mikasa ............. H01L 29/66621 257/E27.084 |

(Continued)

OTHER PUBLICATIONS

Dubrova, "Multiple-Valued Logic in VLSI: Challenges and Opportunities", 1999.
(Continued)

*Primary Examiner* — Igwe U Anya
(74) *Attorney, Agent, or Firm* — Chen Yoshimura LLP

(57) ABSTRACT

The invention provides a multi-Vt vertical power device and a method of making the same. Through patterning a contact mask, a contact structure array having a shared trench gate structure may be formed, and different traversal gaps between an edge of a contact portion of a second conductivity type and an edge of a trench may be formed in the contact structure array. As such, multi-Vt vertical states may be implemented for storing information. The present invention allows making a multi-Vt vertical power device having different Vt's to be capable to store information without additional process steps. Therefore, with respect to the present invention, the process is simple, cost is low, and application field is wide; number of Vt varies to store multi-bit digital information or analog information in the power device; the built-in multi-Vt power MOSFET and IGBT are adapted not only for the high power applications but also for information storage.

10 Claims, 6 Drawing Sheets

(51) Int. Cl.
*H01L 29/739* (2006.01)
*G11C 11/56* (2006.01)
*H03K 19/00* (2006.01)

(52) U.S. Cl.
CPC .......... *H01L 29/7397* (2013.01); *G11C 11/56* (2013.01); *H03K 19/0027* (2013.01)

(58) Field of Classification Search
USPC ........................................................ 257/335
See application file for complete search history.

(56) References Cited

U.S. PATENT DOCUMENTS

| | | | |
|---|---|---|---|
| 2013/0334597 A1* | 12/2013 | Yamashita | H01L 29/7397 257/334 |
| 2016/0035867 A1* | 2/2016 | Pfirsch | H01L 27/0664 257/140 |
| 2017/0018548 A1* | 1/2017 | Laven | H01L 29/0834 |
| 2018/0047821 A1* | 2/2018 | Iwasaki | H01L 29/7827 |
| 2019/0288071 A1* | 9/2019 | Nishiwaki | H01L 29/4236 |

OTHER PUBLICATIONS

Kudoh et al., "Multi-level 2-bit/cell operation utilizing Hf-based MONOS nonvolatile memory", Device Research Conference (DRC), 2018.

Erlbacher et al., "Reduced On Resistance in LDMOS Devices by Integrating Trench Gates Into Planar Technology", IEEE Electron Device Letters, vol. 31, No. 5, pp. 464-466, May 2010.

* cited by examiner

A semiconductor substrate is provided, and the semiconductor substrate comprises an epitaxial layer of a first conductivity type, a well region of a second conductivity type, a source region of the first conductivity type and trench gate structure; wherein the well region of the second conductivity type is positioned in the epitaxial layer of the first conductivity type, the source region of the first conductivity type is positioned in the well region of the second conductivity type, the trench gate structure comprises a gate dielectric layer and a gate conductive layer, the trench gate structure is within the epitaxial layer of the first conductivity type, and passing through the source region of the first conductivity type and the well region of the second conductivity type.

A contact mask on the semiconductor substrate is formed and contact structures in the semiconductor substrate is formed through the contact mask, the contact structures pass through the source region of the first conductivity type to be in mutual contact with the well region of the second conductivity type, and the contact structures comprises the contact portion of the second conductivity type; wherein the contact structures form a contact structure array, the contact structure array has a shared trench gate structure of the trench gate structure, and different traversal gaps between an edge of the contact portion of the second conductivity type and an edge of a trench are formed in the contact structure array.

FIG. 3

STRUCTURE AND METHOD OF NEW POWER MOS AND IGBT WITH BUILT-IN MULTIPLE VT'S

FIELD OF THE INVENTION

The present invention generally relates to a semiconductor technology, and specifically, relates to a structure and a method of new vertical power MOS and IGBT with built-in multiple threshold voltages (multi-Vt's) in device and method of making the same.

BACKGROUND OF THE INVENTION

Multiple-valued logic (MVL) (or multi-bit) transistor, which has two or more possible threshold voltages (Vt's) for logical calculation, may be used for applications, for example a method of solving the binary problems more effectively, and the designing of electrical circuits (by using multi-bit transistors) in multiple-threshold-voltage (multi-Vt) memory, arithmetic circuitry, field programmable gate array (FPGA), etc.

MVL circuit has been implemented with bipolar technologies (e.g. integrated injection logic (IIL), emitter-coupled logic (ECL)), and metal-oxide-semiconductor (MOS) technology (e.g. Charge-coupled device (CCD), metal-oxide-semiconductor field-effect transistor (MOSFET), fin-type field-effect transistor (FINFET), multi-Vt memory (flash, DRAM, NAND, RRAM)), and others (e.g. single electron transistor (SET), carbon nanotube field-effect transistor (CNTFET), etc.)

Please refer to FIGS. 1 and 2. FIG. 2 shows a perspective view (cross-section view through channel) of a multi-Vt logic MOS transistor shown in FIG. 1, where a three Vt logic transistor comprising three channel regions corresponding to three threshold voltages Vt0, Vt1 and Vt2 is constructed by sharing a common gate. The three-Vt logic MOS transistor may reveal four levels of current representing four logic states or two bits i.e. 00, 01, 10 and 11.

However, although multi-Vt logic transistors are more effective and faster than conventional binary logic transistors, the complexity and cost to make multi-Vt logic transistors are higher. Further, the current multi-level or multi-Vt logic MOS transistors may be used for multi-level logic computing or high density memory storage, but seldom for vertical power MOS devices (for storing useful information in power circuits).

Therefore, it is needed to develop a structure and method—for power MOS devices to store digital information without process complexity.

SUMMARY OF THE INVENTION

In one aspect of the invention, an embodiment of the invention is provided that a vertical power MOSFET (or VDMOSFET) with built-in multiple threshold voltage (or multi-Vt) can provide information storage and a method of making the same without process complexity and cost.

A multi-Vt vertical power MOSFET device may comprise: an epitaxial layer of a first conductivity type; a well region of a second conductivity type, the well region of the second conductivity type being within the epitaxial layer of the first conductivity type; a source region of the first conductivity type, the source region of the first conductivity type being within the well region of the second conductivity type; trench gate structure, the trench gate structure comprising a gate dielectric layer and a gate conductive layer, the trench gate structure being within the epitaxial layer of the first conductivity type and passing through the source region of the first conductivity type and the well region of the second conductivity type; and contact structures, passing through the source region of the first conductivity type to be in mutual contact with the well region of the second conductivity type, and comprising a contact portion of the second conductivity type; wherein the contact structures form a contact structure array, the contact structure array has a shared trench gate structure and different traversal gaps (or spacing) between an edge of the contact portion of the second conductivity type and an edge of a trench intentionally formed by layout design in the contact structure array.

Optionally, in the contact structure array, the doping concentration of the second conductivity type within the gap region (i.e. D in FIG. 4) can influence the doping concentration in the channel region (i.e. adjacent to the physical edge of the trench) of the vertical MOS transistor depending on the gap. A higher doping concentration in the channel region adjacent to the physical edge of trench will result in larger Vt of the vertical power MOSFET.

Optionally, in the contact structure array, the doping concentration of the contact portion of the second conductivity type within the gap region may decrease along with increment of the traversal gaps (or spacing). Reversely, a decrease of traversal gap will result in higher doping concentration of the second conductivity type (by dopant diffusion) into the channel region and thus higher Vt of the vertical power MOSFET.

Optionally, the contact structures may comprise the contact portion of the second conductivity type within the well region of the second conductivity type and a metal contact portion passing through the source region of the first conductivity type and being in mutual contact with the contact portion of the second conductivity type.

Optionally, a shape of the contact structures may comprise one or a combination of square and rectangle, and a shape of the trench gate structure may comprise one or a combination of square and rectangle.

Optionally, the first conductivity type may be n type, and the second conductivity type may be p type; or the first conductivity type may be p type, and the second conductivity type may be n type.

Optionally, the multi-Vt vertical power device may comprise a multi-Vt vertical MOSFET (or VDMOSFET) or a multi-Vt vertical IGBT store digital information in the multi-Vt power devices.

A method of making a multi-Vt vertical power device may comprise steps of: providing a semiconductor substrate, the semiconductor substrate comprising an epitaxial layer of a first conductivity type, a well region of a second conductivity type, a source region of the first conductivity type and trench gate structure; wherein the well region of the second conductivity type is positioned in the epitaxial layer of the first conductivity type, the source region of the first conductivity type is positioned in the well region of the second conductivity type, the trench gate structure comprises a gate dielectric layer and a gate conductive layer, the trench gate structure is within the epitaxial layer of the first conductivity type, and passing through the source region of the first conductivity type and the well region of the second conductivity type; and forming a contact mask on the semiconductor substrate and forming contact structures in the semiconductor substrate through the contact mask, the contact structures passing through the source region of the first conductivity type to be in mutual contact with the well region of the second conductivity type, and the contact structures comprising the contact portion of the second conductivity type; wherein the contact structures form a contact structure array, the contact structure array has a shared trench gate structure of the trench gate structure, and different traversal gaps (or spacing) between an edge of the contact portion of the second conductivity type and an edge of a trench are formed (intentionally by layout design) in the contact structure array.

Optionally, in the contact structure array, the doping concentration of the second conductivity type within the gap (i.e. D in FIG. 4) is the channel region of the vertical MOS and may have different doping concentration depending on the gap; in the contact structure array, doping concentration of the second conductivity type in the gap may decrease along with increment of the traversal gaps. Reversely, a decrease of traversal gap will result in higher doping concentration of the second conductivity type (by dopant diffusion) into the channel region and thus higher Vt of the vertical power MOSFET.

Optionally, the step of forming contact structures may comprise: through the contact mask, etching the source region of the first conductivity type to form a the contact trench passing through the source region of the first conductivity type; through the contact mask, implanting a dopant of the second conductivity type in the well region of the second conductivity type to form the contact portion of the second conductivity type; and through the contact mask, forming a metal contact portion filling the contact trench and being in mutual contact with the contact portion of the second conductivity type.

Optionally, the first conductivity type may be n type, and the second conductivity type may be p type; or the first conductivity type may be p type, and the second conductivity type may be n type; the multi-Vt vertical power device may comprise a multi-Vt vertical power MOSFET or a multi-Vt vertical IGBT to store digital information in Vt of the multi-Vt vertical power device.

Optionally, the step of providing a semiconductor substrate may comprise: forming the epitaxial layer of the first conductivity type; forming the trench gate structure in the epitaxial layer of the first conductivity type, the trench gate structure comprising the gate dielectric layer and the gate conductivity layer; through a well region mask, forming the well region of the second conductivity type in the epitaxial layer of the first conductivity type which is between the trench gate structure; and through a source region mask, forming the source region of the first conductivity type in the well region of the second conductivity type.

As mentioned above, the multi-Vt vertical power device providing information storage and the method of making the same may bring these benefits: when making the contact structures, through patterning the contact mask, the contact structure array having the shared trench gate structure may be formed, and different traversal gaps between the edge of the contact portion of the second conductivity type and the edge of the trench gate structure may be formed (by layout) in the contact structure array. As such, multi-Vt logic states may be implemented so as to carry out a power device having the multi-Vt logic states for storing information. The present invention allows making the multi-Vt vertical power device having different Vt's to be capable of information storage without additional process steps. Therefore, with respect to the present invention, the process is simple, cost is low, and application field is wide; number of Vt levels can be varied to store multi-bit digital information or analog information in the vertical power device; the built-in multi-Vt power MOSFET and IGBT are adapted not only for high current applications but also with capability of information storage.

BRIEF DESCRIPTION OF THE DRAWINGS

Various objects and advantages of the present invention will be more readily understood from the following detailed description when read in conjunction with the appended drawing, in which:

FIG. 3 shows a process flow chart of a method of making a vertical power MOS device with multi-Vt's according to an embodiment of the present invention;

DESCRIPTION OF EMBODIMENTS OF THE INVENTION

Figure 1:
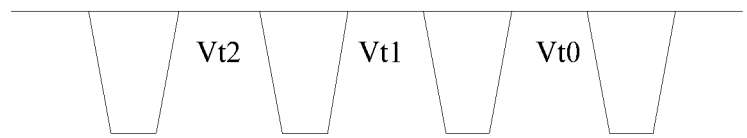
FIG. 1 shows a perspective view (cross-section view through the channel) of a planar structure of a conventional multi-Vt MOS transistor.
Figure 2:
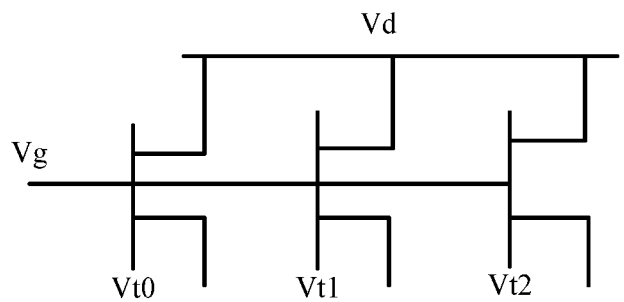
FIG. 2 shows a perspective view of a circuit representation of the conventional multi-Vt MOS transistor shown in FIG. 1.

Reference is now made to the following concrete examples taken in conjunction with the accompanying drawings to illustrate implementation of the present invention. Persons of ordinary skill in the art having the benefit of the present disclosure will understand other advantages and effects of the present invention. The present invention may be implemented with other examples. For various view or application, details in the present disclosure may be used for variation or change for implementing embodiments within the scope of the present invention.

Please note that the drawings provided here are only for examples but not limited to the specific number or scale shown therein. When implementing the examples according to the drawings, condition, number and proportion of each element may be changed and arrangement of the elements may be in a more complex way in three-dimensional sizes such as length, width and depth. Cross-sectional views may be enlarged but not in proportion.

Please also note that terms to illustrate spatial relation used here, such as "below," "under," "lower than," "on," "above," etc., are taken to describe a relation between an element or feature and other element(s) or feature(s). It is readily to be understood that such terms comprise other direction(s) of an operating device not shown in the figures. Further, when a layer is described as being between two layers, it may be the only layer or layered along with other layer(s) between the two layers. "Between" comprises values at two ends.

Please further note that when describing a first feature is on a second feature, such description comprises an embodiment in which the first feature is in direct contact with the second feature and another embodiment in which the first feature is in indirect contact with the second feature and another feature is formed therebetween.

Please refer to FIG. 3 which shows a method of making a multi-Vt vertical power device according to an embodiment of the present invention. When making contact structures, through patterning a contact mask, a contact structure array having a shared trench gate structure may be formed, and different traversal gaps (or spacings) between an edge of a contact portion of a second conductivity type and an edge of a trench may be formed in the contact structure array. As such, multi-Vt logic states may be implemented for the storage of multi-Vt states. The present invention allows making a multi-Vt vertical power device having different Vt's for information storage without additional process steps. Therefore, with respect to the present invention, the process is simple, cost is low, and applications are wide; number of Vt's can be varied to store multi-bit digital information or analog information in the power device; built-in multi-Vt power MOSFET and IGBT are adapted to high current application with capability of digital information storage.

For example, the first conductivity type may be n type, and the second conductivity type may be p type; or the first conductivity type may be p type, and the second conductivity type may be n type. In the present embodiment, the first conductivity type is not limited to n type, and the second conductivity type is also not limited to p type.

For example, the multi-Vt vertical power device may comprise a multi-Vt vertical MOSFET or a multi-Vt vertical IGBT, etc. for storing digital information in the multi-Vt vertical power device.

Specifically, type and structure of the multi-Vt vertical power device may be varied to meet a requirement and associated layers may be formed accordingly. In the present embodiment, referring to FIG. 4, an exemplary multi-Vt VDMOSFET is illustrated, but it is not intended to limit the type of the multi-Vt vertical power device.

A structure of the multi-Vt vertical power device and a method of making the same according to the present embodiment are illustrated with figures as follows.

Figure 4:
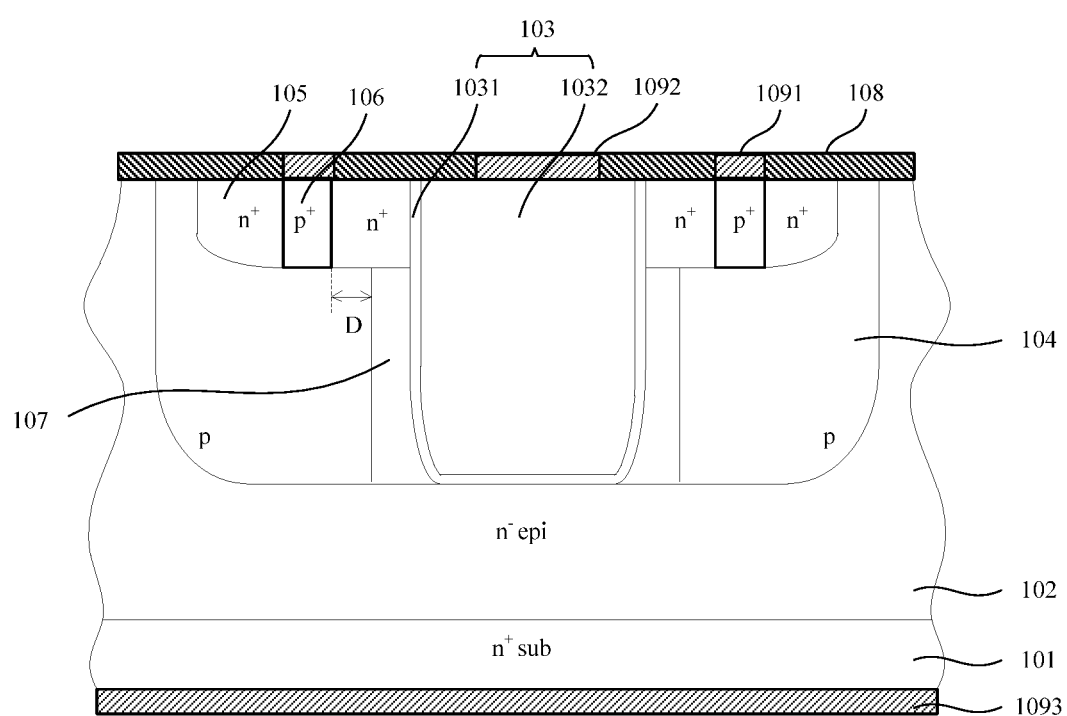
FIG. 4 shows a perspective view of a structure of a vertical power MOS device according to an embodiment of the present invention.

At first, a semiconductor substrate is provided. The semiconductor substrate may comprise an epitaxial layer of the first conductivity type 102, a well region of the second conductivity type 104, a source region of the first conductivity type 105 and a trench gate structure 103. The well region of the second conductivity type 104 may be positioned in the epitaxial layer of the first conductivity type 102. The source region of the first conductivity type 105 may be positioned in the well region of the second conductive type 104. The trench gate structure 103 may comprise a gate dielectric layer 1031 and a gate conductive layer 1032. The trench gate structure 103 may be positioned in the epitaxial layer of the first conductivity type 102, and passing through the source region of the first conductive type 105 and the well region of the second conductivity type 104, so as to form a vertical dual channel layer 107 next to the physical edge of trench. It is readily to be understood that only one unit of the multi-Vt vertical power device is shown in FIG. 4, and in actual implementations, the multi-Vt vertical power device may comprise repeating identical or different units.

For example, steps to make the semiconductor substrate may comprise: providing the substrate of the first conductivity type 101; forming the epitaxial layer of the first conductivity type 102 on the substrate of the first conductivity type 101; forming the trench gate structures 103 in the epitaxial layer of the first conductivity type 102, in which the trench gate structures 103 may comprise the gate dielectric layer 1031 and the gate conductivity layer 1032; through a well region mask, forming the well region of the second conductivity type 104 in the epitaxial layer of the first conductivity type 102 which is between the trench gate structures 103; through a source region mask, forming the source region of the first conductivity type 105 in the well region of the second conductivity type 104.

Please note that above-mentioned steps to form the semiconductor substrate and structure of the semiconductor substrate may not be limited to the disclosure but may be varied to meet a requirement.

Specifically, when providing the substrate of the first conductivity type 101, material of the substrate of the first conductivity type 101 may be but not limited to doped semiconductor materials, such as silicon (Si), silicon-germanium (SiGe), gallium nitride (GaN) or silicon carbide (SiC), etc.

Then, on the substrate of the first conductivity type 101, the epitaxial layer of the first conductivity type 102 is grown through epitaxial (epi) growth.

Then, in the epitaxial layer of the first conductivity type 102, the trench gate structure 103 is formed, and the trench gate structure 103 comprises the gate dielectric layer 1031 and the gate conductivity layer 1032.

In the present embodiment, the trench gate structure 103 may assist in shrinking unit area of the power device. Steps to make the trench gate structure 103 may comprise: etching the epitaxial layer of the first conductivity type 102 to form the gate trench; with a thermal oxidation growth technology, a layer of the gate dielectric layer 1031 covering a bottom and a sidewall of the gate trench is grown on a surface of the gate trench; depositing polysilicon in the gate trench to form the gate conductive layer 1032; wherein the steps to make the trench gate structure 103 may not be limited to what is disclosed here, and in some other embodiment, the trench gate structure may be designed as other structures such as a split gate structure, and actual processes to make the trench gate structure are not limited.

Figure 5:
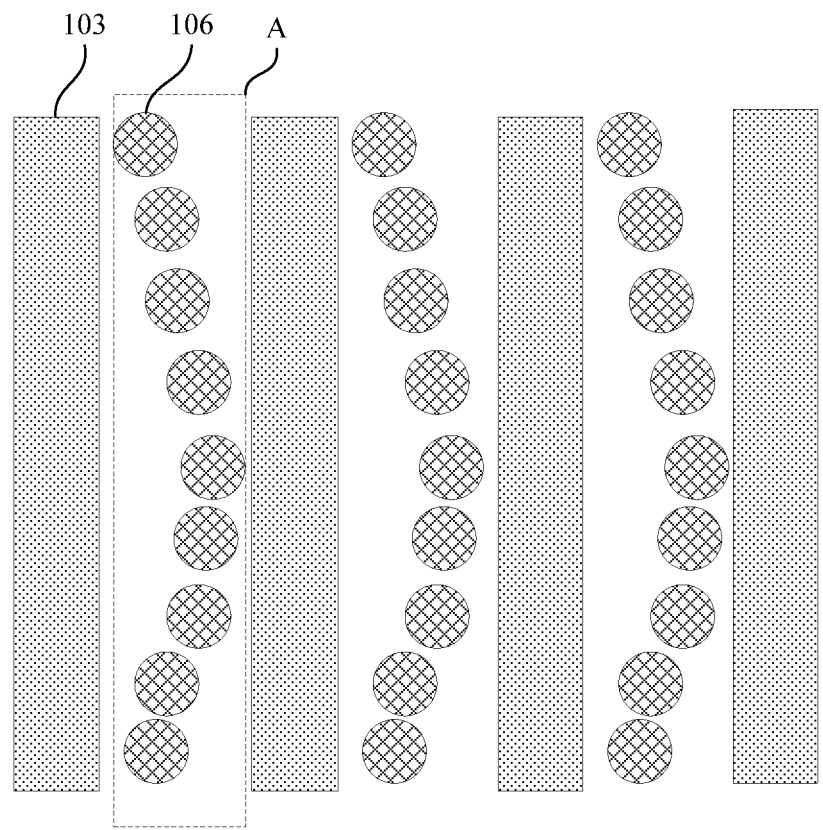
FIG. 5 shows a top view of a partial structure of a multi-Vt power MOS device according to an embodiment of the present invention.

Then, as shown in FIG. 4 and FIG. 5, the contact structures may be made with steps comprising: forming the contact mask on the semiconductor substrate; through the contact mask, forming the contact structures in the semiconductor substrate, in which the contact structures may pass through the source region of the first conductivity type 105 to be in mutual contact with the well region of the second conductivity type 104, and the contact structures may comprise the contact portion of the second conductivity type 106; wherein the formed contact structures may construct the contact structure array A, the contact structure array A may have a shared trench gate structure 103, and different traversal gaps D between an edge of the contact portion of the second conductivity type 106 and an edge of the channel layer 107. Since the channel depletion layer is relatively thin (~50 nm), the edge of the channel layer is essentially the same as the edge of the physical trench edge.

Specifically, on a surface of the semiconductor substrate, a layer of mask material may be deposited, in which deposition technologies such as chemical vapor deposition (CVD) may be comprised, and the layer of mask material may be but not limited to silicon dioxide.

Then, on a surface of the layer of mask material, through a photolithography technology, a layer of patterned photoresist defining the contact structures may be formed, and through a dry etching technology, taking the layer of photoresist as an etching mask, the layer of mask material may be dry etched to form the contact mask having a pattern of the contact structures.

Then, through the patterned contact mask, in the source region of the first conductivity type 105, the dopant of the second conductivity type may be implanted to form the contact structures which is in mutual contact with the well region of the second conductivity type 104.

In the present embodiment, the contact structures may be formed through implanting the dopant of the second conductivity type in the source region of the first conductivity type 105. As such, the source region of the first conductivity type 105 may be in short circuit with the contact portion of the second conductive type 106 directly. However, type and structure of the contact structures may not be limited to what is disclosed here, and alternately, the contact structures may be trench contact structures, wherein steps to from the trench contact structures may comprise: through the contact mask, etching the source region of the first conductivity type 105 to form the contact trench passing through the source region of the first conductivity type 105; through the contact mask, in the well region of the second conductivity type 104, implanting the dopant of the second conductivity type to form the contact portion of the second conductivity type 106; through the contact mask, forming the metal contact portion filling the contact trench, and the metal contact portion and the contact portion of the second conductivity type 106 being in mutual contact; wherein through the trench contact structures, the contact portion of the second conductivity type 106 and the metal contact portion may be formed, the contact portion of the second conductivity type 106 may be in the well region of the second conductivity type 104 and the metal contact portion may pass through the source region of the first conductivity type 105 to be in mutual contact with the contact portion of the second conductivity type 106, and the metal contact portion may be tungsten metal (W) for reduced resistance. The trench contact structure can shrink area than the traditional planar contact structures. Please note that actual choices in relation to the contact structures may be flexible and not limited to what is disclosed here.

Figure 6:
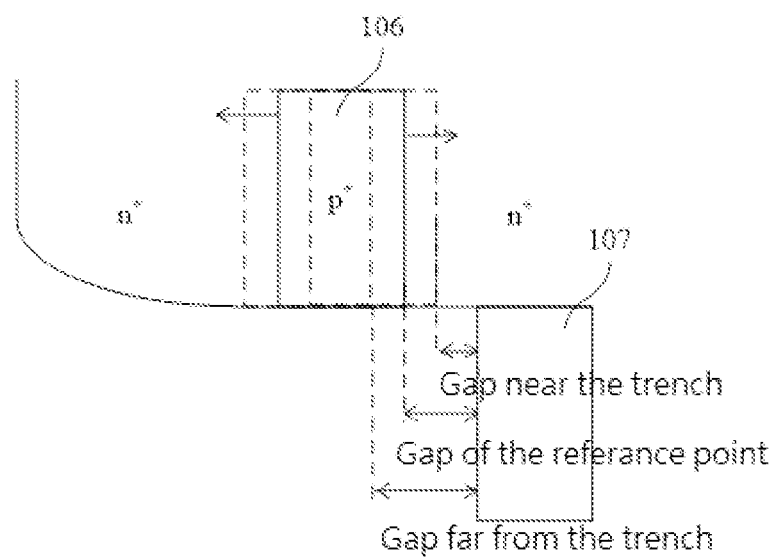
FIG. 6 shows an enlarged view of a structure of traversal gaps (or spacing) between an edge of a contact portion of a second conductivity type and an edge of a trench according to an embodiment of the present invention.

In the present embodiment, through patterning the contact mask, a plurality of contact structure array A may be formed, as shown in FIG. 5. In the contact structure array A, several contact structures may have a shared trench gate structure 103, and different traversal gaps D between the edge of the contact structures and the edge of the trench 107 may be formed to implement multi-Vt logic states as shown in FIG. 6. Please note that no other additional step is added in the present embodiment, and under this situation, the multi-Vt vertical power device having different Vt's and being capable to store information may be made. The process to make such a multi-Vt vertical power device is simple, cost thereof is low, and application field is wide. Further, the number of Vt in the multi-Vt vertical power device is varied for storing multi-bit digital information or analog information. The built-in multi-Vt power MOSFET and IGBT are adapted to high current applications with capability of information storage.

For example, in the contact structure array A, the formed contact portion of the second conductivity type 106 may have different doping concentrations.

Specifically, through the different doping concentrations, effect of forming multiple Vt's may be enhanced, and actual doping concentration may not be limited here. Dopant of the contact portion of the second conductivity type 106 may comprise but not limited to boron (B), and other dopants, such as dopants with opposite conductive type, for instance, phosphor (P), arsenic (As), antimony (Sb), etc., which may be chosen to meet actual needs of conductivity type and other requirement.

For example, in the contact structure array A, the doping concentrations of the formed contact portion of the second conductivity type 106 may be but not limited to decreased along with increment of the traversal gaps D to further enhance the effect of forming the multiple Vt's. For instance, the doping concentrations of the contact portion of the second conductivity type 106 may be increased or randomly varied along with increment of the traversal gaps D.

For example, in the contact structure array A, the contact portion of the second conductivity type 106 may be distributed i.e. randomly distributed according to requirement, and not limited to what is disclosed here.

For example, a shape of the contact structures may comprise one or a combination of rectangle and square; a shape of the trench gate structure 103 may comprise one or a combination of rectangle and square. Thus, the sizes, shape and appearance of the contact structures and the trench gate structure 103 are not limited to what is disclosed here and may be chosen to meet requirement.

For example, the traversal gaps D between the edge of the contact portion of the second conductivity type 106 and the edge of the trench 107 in the contact structures may be within 0 μm-3 μm, etc., but not limited to what is disclosed here. The traversal gaps D may be designed (by layout) to meet actual requirement.

For example, steps of forming an interlayered dielectric layer 108, a source metal layer 1091, a gate metal layer 1092 and the drain metal layer 1093 may be further comprised to form a multi-Vt VDMOSFET.

For example, a step of forming the buffer layer of the first conductivity type at a bottom surface of the epitaxial layer of the first conductivity type 102 may be further comprised.

Specifically, the doping concentration of the buffer layer of the first conductivity type may be between the doping concentration of the substrate of the first conductivity type 101 and the doping concentration of the epitaxial layer of the first conductivity type 102. As such, through the buffer layer of the first conductivity type, in the multi-Vt VDMOSFET, diffusion of impure atoms the substrate of the first conductivity type 101 to the epitaxial layer of the first conductivity type 102 may be prevented during a high temperature process step. Then, a problem such as lower breakdown voltage due to raised doping concentration of the epitaxial layer of the first conductivity type 102 and tail current occurred during turning off the device may be solved.

A method of making a multi-Vt logic IGBT is provided in the present embodiment. A major difference between the steps to make the multi-Vt VDMOSFET in FIG. 4 is an additional step to form an implanted layer of the second conductivity type between the drain metal layer 1093 and the epitaxial layer of the first conductivity type 102. Specifically, through a CMP process, the substrate of the first conductivity type 101 may be removed, and through implanting the dopant of the second conductivity type, the implanted layer of the second conductivity type may be formed. Please note that these steps are not limited to what is disclosed here.

Figure 7:
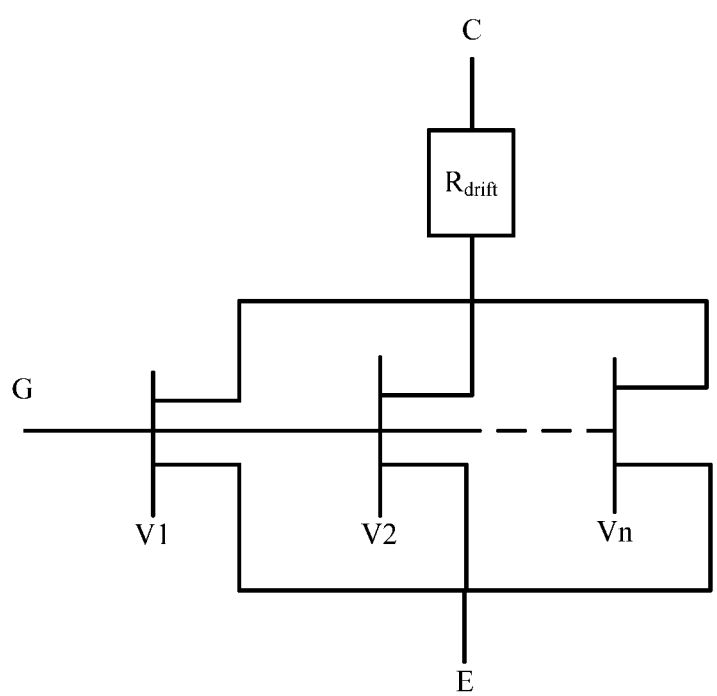
FIG. 7 shows a perspective view of an equivalent circuit of a multi-Vt vertical power device according to an embodiment of the present invention.
Figure 8:
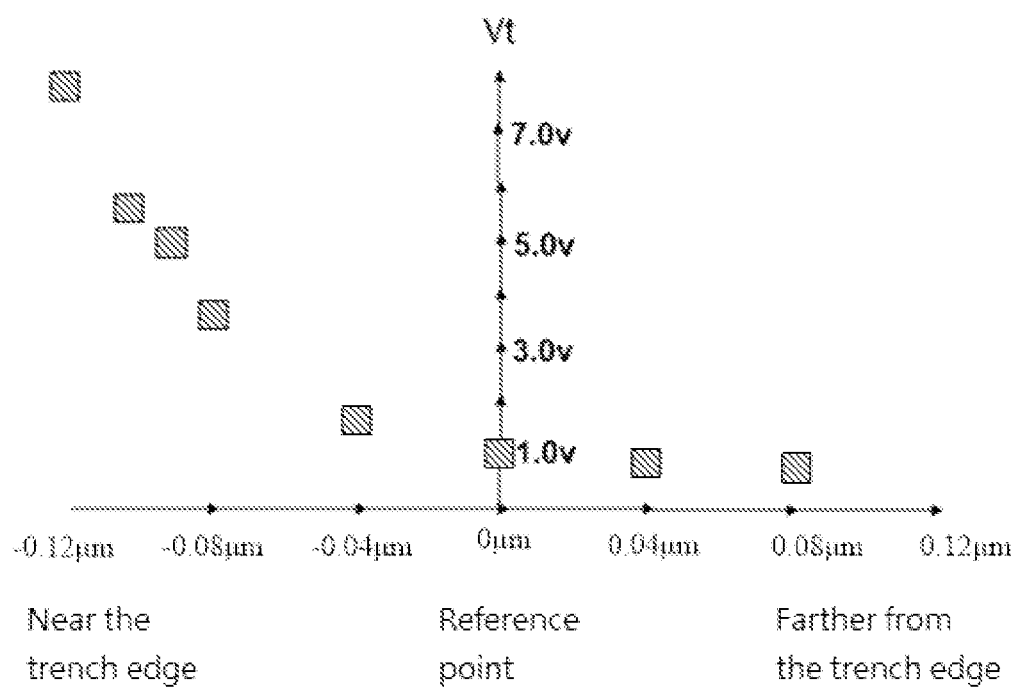
FIG. 8 shows a simulation relation of variation of Vt along with traversal gaps according to an embodiment of the present invention.

Referring to FIG. 7, a perspective view of a circuit of the multi-Vt vertical power device is shown. In the present embodiment, a simulation of the multi-Vt vertical power device is performed with results shown in the following table and FIG. 8.

| The contact portion of the second conductive type | Traversal gap (um) | Vt (V) |
|---|---|---|
|  | 0 (Reference point) | 1 |
| 1 | −0.04 | 1.34 |
| 2 | −0.08 | 3.45 |
| 3 | −0.1 | 5.65 |
| 4 | −0.12 | 8 |
| 5 | 0.04 | 0.9 |
| 6 | 0.08 | 0.85 |
| 7 | 0.1 | 0.82 |

Please note that in the above table, a minus value represents the traversal gaps D approaching (near) the trench edge 107 from a reference point, and a positive value represents the traversal gaps D apart (away) from the trench edge 107 from a reference point. Please refer to FIG. 6 also. According to the above table and FIG. 8, it is readily understood that when the traversal gaps D is smaller (i.e. toward more negative), the threshold voltage Vt is higher as expected.

As shown in FIG. 4, a multi-Vt vertical power device which is capable to store information is provided in the present embodiment. The multi-Vt vertical power device may be made with one of above-mentioned methods. Please note that process and material to make the multi-Vt vertical power device may be chosen to meet requirement and not limited to what is disclosed here. In the present embodiment, the multi-Vt vertical power device may be made with one of above-mentioned methods directly and therefore not repeated.

Specifically, the multi-Vt vertical power device may comprise the epitaxial layer of the first conductivity type 102, the well region of the second conductivity type 104, the source region of the first conductivity type 105, the trench gate structure 103 and the contact structures. The well region of the second conductivity type 104 may be positioned in the epitaxial layer of the first conductivity type 102. The source region of the first conductivity type 105 may be positioned in the well region of the second conductivity type 104. The trench gate structure 103 may comprise the gate dielectric layer 1031 and the gate conductive layer 1032. The trench gate structure 103 may be positioned in the epitaxial layer of the first conductivity type 102, and passing through the source region of the first conductivity type 105 and the well region of the second conductivity type 104. The contact structures may pass through the source region of the first conductivity type 105 to be in mutual contact with the well region of the second conductivity type 104. The contact structures may comprise the contact portion of the second conductivity type 106. The formed contact structures may construct the contact structure array A, the contact structure array A may have a shared trench gate structure 103, and in the contact structure array A, an edge of the contact portion of the second conductivity type 106 and an edge of the trench 107 may form different traversal gaps D.

For example, in the contact structure array A, the contact portion of the second conductivity type 106 may have different doping concentrations.

Specifically, through the different doping concentrations, the effect of forming the multiple Vt's may be further enhanced, and the dopant of the contact portion of the second conductivity type 106 may comprise B and not limited to what is disclosed here. Rather, dopants having opposite conductivity type such as P, As, Sb, etc., may be chosen to meet the actual conductive and requirement.

For example, in the contact structure array A, the doping concentration of the contact portion of the second conductivity type 106 may be increased to enhance the effect of forming the multiple Vt's.

For example, in the contact structure array A, distribution of the gap of contact portion of the second conductivity type 106 may be not limited to discrete.

For example, a shape of the contact structures may comprise one or a combination of square and rectangle, and a shape of the trench gate structure 103 may comprise one or a combination of square and rectangle. Sizes, appearance of the contact structures and the trench gate structure 103 may be chosen according to requirement and not limited to what is disclosed here.

For example, the contact structures may comprise the contact portion of the second conductivity type 106 positioned in the well region of the second conductivity type 104 and the metal contact portion passing through the source region of the first conductivity type 105 and being in mutual contact with the contact portion of the second conductivity type 106 to provide the trench contact structures, but are not limited to what is disclosed here.

For example, the first conductivity type may be n type, and the second conductivity type may be p type; or the first conductivity type may be p type, and the second conductivity type may be n type.

For example, the multi-Vt vertical power device comprising the multi-Vt vertical power MOSFET or the multi-Vt vertical IGBT, may store digital information.

To sum up, according to the multi-Vt vertical power device providing information storage and the method of making the same of the present invention, when making the contact structures, through patterning the contact mask, the contact structure array having the shared trench gate structure may be formed, and different traversal gaps between the edge of the contact portion of the second conductivity type and the edge of the trench gate structure may be formed in the contact structure array. The present invention allows making the multi-Vt vertical power device having different Vt's to be capable of storing information without additional process steps. Therefore, with respect to the present invention, the process is simple, cost is low, and application field is wide; the number of Vt varies to store multi-bit digital information or analog information in the power device; the built-in multi-Vt power MOSFET and IGBT are adapted to high current application with capability of information storage.

It is to be understood that these embodiments are not meant as limitations of the invention but merely exemplary descriptions of the invention. Indeed, different adaptations may be apparent to those skilled in the art without departing from the scope of the annexed claims.

What is claimed is:

1. A multiple-threshold-voltage (multi-Vt) vertical power device, comprising:
    an epitaxial layer of a first conductivity type;
    a well region of a second conductivity type, the well region of the second conductivity type being within the epitaxial layer of the first conductivity type;
    a source region of the first conductivity type, the source region of the first conductivity type being within the well region of the second conductivity type;

trench gate structure, the trench gate structure comprising a gate dielectric layer and a gate conductive layer, the trench gate structure being within the epitaxial layer of the first conductivity type and passing through the source region of the first conductivity type and the well region of the second conductivity type; and contact structures, passing through the source region of the first conductivity type to be in mutual contact with the well region of the second conductivity type, and comprising a contact portion of the second conductivity type;

wherein the contact structures form a contact structure array, the contact structure array has a shared trench gate structure and different traversal gaps between an edge of the contact portion of the second conductivity type and an edge of a trench, and wherein in the contact structure array, the doping concentration in the gap region of the second conductivity type decreases along with increment of the traversal gaps.

2. The multi-Vt vertical power device according to claim 1, wherein in the contact structure array, the contact portion of the second conductivity type has different doping concentration.

3. The multi-Vt vertical power device according to claim 1, wherein the contact structures comprise the contact portion of the second conductivity type within the well region of the second conductivity type and a metal contact portion passing through the source region of the first conductivity type and being in mutual contact with the contact portion of the second conductivity type.

4. The multi-Vt vertical power device according to claim 1, wherein a shape of the contact structures comprises one or a combination of square and rectangle, and a shape of the trench gate structure comprises one or a combination of square and rectangle.

5. The multi-Vt vertical power device according to claim 1, wherein the first conductivity type is n type, and the second conductivity type is p type; or the first conductivity type is p type, and the second conductivity type is n type.

6. The multi-Vt logic power device according to claim 1, wherein the multi-Vt vertical power device comprises a multi-Vt vertical power MOSFET or a multi-Vt vertical IGBT, store digital information in a threshold voltage (Vt) of the multi-Vt vertical power device.

7. A method of making a multi-Vt vertical power device, comprising steps of:

providing a semiconductor substrate, the semiconductor substrate comprising an epitaxial layer of a first conductivity type, a well region of a second conductivity type, a source region of the first conductivity type and trench gate structure; wherein the well region of the second conductivity type is positioned in the epitaxial layer of the first conductivity type, the source region of the first conductivity type is positioned in the well region of the second conductivity type, the trench gate structure comprise a gate dielectric layer and a gate conductive layer, the trench gate structure are within the epitaxial layer of the first conductivity type, and passing through the source region of the first conductivity type and the well region of the second conductivity type; and forming a contact mask on the semiconductor substrate and forming contact structures in the semiconductor substrate through the contact mask, the contact structures passing through the source region of the first conductivity type to be in mutual contact with the well region of the second conductivity type, and the contact structures comprising the contact portion of the second conductivity type;

wherein the contact structures form a contact structure array, the contact structure array has a shared trench gate structure and different traversal gaps between an edge of the contact portion of the second conductivity type and an edge of a trench, and wherein in the contact structure array, the contact portion of the second conductivity type has different doping concentration; in the contact structure array, the doping concentration in the gap region of the second conductivity type decreases along with increment of the traversal gaps.

8. The method of making a multi-Vt vertical power device according to claim 7, wherein the step of forming contact structures comprises:

through the contact mask, etching the source region of the first conductivity type to form a contact trench passing through the source region of the first conductivity type;

through the contact mask, implanting a dopant of the second conductivity type in the well region of the second conductivity type to form the contact portion of the second conductivity type; and through the contact mask, forming a metal contact portion filling the contact trench and being in mutual contact with the contact portion of the second conductivity type.

9. The method of making a multi-Vt logic power device according to claim 7, wherein the first conductivity type is n type, and the second conductivity type is p type; or the first conductivity type is p type, and the second conductivity type is n type; the multi-Vt logic power device comprises a multi-Vt vertical MOSFET or a multi-Vt vertical IGBT for storing digital information.

10. The method of making a multi-Vt vertical power device according to claim 7, wherein the step of providing a semiconductor substrate comprises:

forming the epitaxial layer of the first conductivity type;

forming the trench gate structure in the epitaxial layer of the first conductivity type, the trench gate structure comprising the gate dielectric layer and the gate conductive layer;

through a well region mask, forming the well region of the second conductivity type in the epitaxial layer of the first conductivity type which is between the trench gate structure; and through a source region mask, forming the source region of the first conductivity type in the well region of the second conductivity type.

* * * * *